(12) United States Patent
Schramm et al.

(10) Patent No.: US 9,951,779 B2
(45) Date of Patent: Apr. 24, 2018

(54) METHODS AND SYSTEMS FOR SUBSEA BOOSTING WITH DIRECT CURRENT AND ALTERNATING CURRENT POWER SYSTEMS

(71) Applicant: General Electric Company, Schenectady, NY (US)

(72) Inventors: Simon Herbert Schramm, Bavaria (DE); Manoj Ramprasad Shah, Latham, NY (US); Siddharth Navinchandra Ashar, Bavaria (DE); Christof Martin Sihler, Bavaria (DE); Svend Erik Rocke, Lier (NO); Vittorio Michelassi, Bavaria (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 232 days.

(21) Appl. No.: 14/243,394

(22) Filed: Apr. 2, 2014

(65) Prior Publication Data

US 2015/0184660 A1 Jul. 2, 2015

Related U.S. Application Data

(60) Provisional application No. 61/921,223, filed on Dec. 27, 2013.

(51) Int. Cl.
*F04D 13/08* (2006.01)
*F04D 27/00* (2006.01)
(Continued)

(52) U.S. Cl.
CPC ........ *F04D 13/086* (2013.01); *E21B 33/0385* (2013.01); *E21B 41/0007* (2013.01);
(Continued)

(58) Field of Classification Search
CPC ...... F04D 13/086; F04D 27/005; F04D 13/08; F04D 29/40; F04B 35/04; E21B 33/0385;
(Continued)

(56) References Cited

U.S. PATENT DOCUMENTS 5,137,086 A * 8/1992 Stokley ................ E21B 49/082
166/191
5,820,354 A 10/1998 Wild
(Continued)

FOREIGN PATENT DOCUMENTS

EP 2487327 A1 8/2012
EP 2501212 A1 9/2012
(Continued)

OTHER PUBLICATIONS

European Search Report and Opinion issued in connection with corresponding EP Application No. 14199483 dated May 29, 2015.
(Continued)

*Primary Examiner* — Patrick Hamo
*Assistant Examiner* — Connor Tremarche
(74) *Attorney, Agent, or Firm* — Pabitra K. Chakrabarti

(57) ABSTRACT

A subsea boosting module for use with an alternating current (AC) power system includes a housing defining at least one interior chamber. A fluid pump is disposed within the interior chamber. An electric motor is disposed within the interior chamber and drivingly coupled to the fluid pump. A plurality of power components is disposed within the interior chamber to deliver power to the electric motor.

19 Claims, 10 Drawing Sheets

(51) Int. Cl.
*E21B 41/00* (2006.01)
*E21B 33/038* (2006.01)
*E21B 43/01* (2006.01)
*H05K 7/20* (2006.01)
*F04D 29/40* (2006.01)
*H02J 3/34* (2006.01)

(52) U.S. Cl.
CPC .............. *E21B 43/01* (2013.01); *F04D 13/08* (2013.01); *F04D 27/005* (2013.01); *H05K 7/20927* (2013.01); *F04D 29/40* (2013.01); *H02J 3/34* (2013.01)

(58) Field of Classification Search
CPC .... E21B 41/0007; E21B 43/01; E21B 43/017; E21B 49/082; H02M 5/458; H02J 3/34; H05K 7/20927; B24C 1/045
USPC .......................................................... 417/53
See application file for complete search history.

(56) References Cited

U.S. PATENT DOCUMENTS

| | | |
|---|---|---|
| 6,873,063 B1 | 3/2005 | Appleford et al. |
| 7,817,422 B2 | 10/2010 | Gunturi et al. |
| 7,851,943 B2 | 12/2010 | Datta et al. |
| 7,880,419 B2 | 2/2011 | Sihler et al. |
| 8,097,810 B2 | 1/2012 | Benestad et al. |
| 8,123,549 B2 | 2/2012 | Jazowski et al. |
| 8,303,312 B2 | 11/2012 | Raad et al. |
| 8,373,307 B2 | 2/2013 | Sihler et al. |
| 2003/0153468 A1 | 8/2003 | Soelvik |
| 2005/0116799 A1* | 6/2005 | Ostergaard ........... H01R 13/523 335/132 |
| 2009/0226262 A1 | 9/2009 | Karstad et al. |
| 2009/0296433 A1 | 12/2009 | Sihler et al. |
| 2010/0038774 A1 | 2/2010 | Zhang et al. |
| 2010/0119382 A1* | 5/2010 | Scarsdale ................ F04B 35/04 417/53 |
| 2010/0133901 A1* | 6/2010 | Zhang ................... H02M 5/458 307/11 |
| 2011/0247825 A1 | 10/2011 | Batho et al. |
| 2011/0251728 A1 | 10/2011 | Batho et al. |
| 2011/0300008 A1 | 12/2011 | Fielder |
| 2012/0217802 A1 | 8/2012 | Kanakasabai et al. |
| 2012/0255792 A1* | 10/2012 | Blange .................... B24C 1/045 175/424 |
| 2012/0279720 A1* | 11/2012 | Whitby ............... E21B 33/0355 166/363 |
| 2013/0025874 A1* | 1/2013 | Saunders ................ E21B 49/08 166/357 |
| 2013/0026831 A1 | 1/2013 | Sihler et al. |
| 2013/0032314 A1* | 2/2013 | Baerd ................ H05K 7/20927 165/104.33 |
| 2013/0043035 A1* | 2/2013 | Hale .................... E21B 43/017 166/338 |
| 2013/0169044 A1 | 7/2013 | Stinessen et al. |
| 2013/0183853 A1 | 7/2013 | Sivik et al. |
| 2013/0258733 A1 | 10/2013 | Zhang et al. |

FOREIGN PATENT DOCUMENTS

| | | |
|---|---|---|
| GB | 1305990 A | 2/1973 |
| GB | 1306469 A | 2/1973 |
| WO | 2004111389 A1 | 12/2004 |
| WO | 2012141599 A1 | 10/2012 |
| WO | 2013039403 A1 | 3/2013 |
| WO | 2013039404 A1 | 3/2013 |
| WO | 2013077744 A1 | 5/2013 |
| WO | 2015024005 A2 | 2/2015 |

OTHER PUBLICATIONS

U.S. Appl. No. 13/600,556, filed Aug. 31, 2012.
U.S. Appl. No. 13/478,310, filed May 23, 2012.
U.S. Appl. No. 13/946,408, filed Jul. 19, 2013.
European Search Report and Opinion issued in connection with corresponding EP Application No. 14199485.5 dated Jun. 1, 2015.

* cited by examiner

METHODS AND SYSTEMS FOR SUBSEA BOOSTING WITH DIRECT CURRENT AND ALTERNATING CURRENT POWER SYSTEMS

CROSS REFERENCE TO RELATED APPLICATIONS

This application claims priority to U.S. Provisional Patent Application Ser. No. 61/921,223, filed Dec. 27, 2013, which is hereby incorporated by reference in its entirety.

BACKGROUND

This description relates to subsea boosting, more particularly, to systems and methods for subsea boosting in high-voltage direct current (HVDC) and/or high-voltage alternating current (HVAC) transmission and distribution systems.

As oil and gas fields in shallow waters diminish, producers are tapping offshore fields in deeper waters with oil installations that operate far below the surface of the sea. The typical equipment for such subsea oil recovery and production include gas compressors and various pumps for multiple functions. Electric variable speed drive (VSD) and motor systems are one way to power such equipment directly under the deep water. Therefore, the delivery of electric power from a remote onshore utility grid or power generation is important to secure a reliable production and processing of oil and gas in subsea locations. Typically, the transmission power requirement is up to several hundred megawatts for medium to large oil/gas fields.

Alternating current (AC) transmission and distribution systems are one technology suited for delivery of power to subsea locations. Such systems typically deliver AC power from a platform or onshore location to a large subsea transformer through a large power cable. Power is transferred from the subsea transformer to subsea AC switchgear through another power cable. The subsea AC switchgear feeds AC power to one or more subsea VSDs via yet another cable. The VSDs each provide variable AC power to electric motors via a power cable. The connections between components in subsea AC distribution systems typically require wet mateable connectors, which are significantly more complex and expensive than dry mateable connectors. In addition, the power requirement and thus the size of components in subsea boosting systems has generally increased over time. Some known systems utilize three to five megavolt-ampere (MVA) pumps, each of which may weigh more than ten tons. Other components in known subsea boosting systems and/or AC transmission and distribution systems are also very large and/or heavy. Moreover, some AC transmission and distribution topologies face technical challenges, which become more significant when transmission distance is in excess of fifty kilometers.

BRIEF DESCRIPTION

In one embodiment, a subsea boosting module for use with an alternating current (AC) power system includes a housing defining at least one interior chamber. A fluid pump is disposed within the interior chamber. An electric motor is disposed within the interior chamber and drivingly coupled to the fluid pump. A plurality of power components is disposed within the interior chamber to deliver power to the electric motor.

In another embodiment, a subsea boosting system for use with an alternating current (AC) power system includes a plurality of subsea boosting modules. Each subsea boosting module includes a fluid pump, an electric motor drivingly coupled to the fluid pump, and a plurality of power components configured to deliver power to the electric motor. The plurality of subsea boosting modules are electrically coupled together in parallel. The fluid pumps of the plurality of subsea modules are coupled together in fluid communication.

In yet another embodiment, a method of producing a subsea boosting system for use with an alternating current (AC) power system is described. The subsea boosting system has a first power rating. The method includes electrically coupling together a plurality of subsea boosting modules, each of which includes a fluid pump, an electric motor, and a plurality of power components. The subsea boosting modules each have a second power rating less than the first power rating. The method includes coupling together in fluid communication the fluid pumps of the subsea boosting modules.

DRAWINGS

These and other features, aspects, and advantages of the present disclosure will become better understood when the following detailed description is read with reference to the accompanying drawings in which like characters represent like parts throughout the drawings, wherein.

Figure 1:
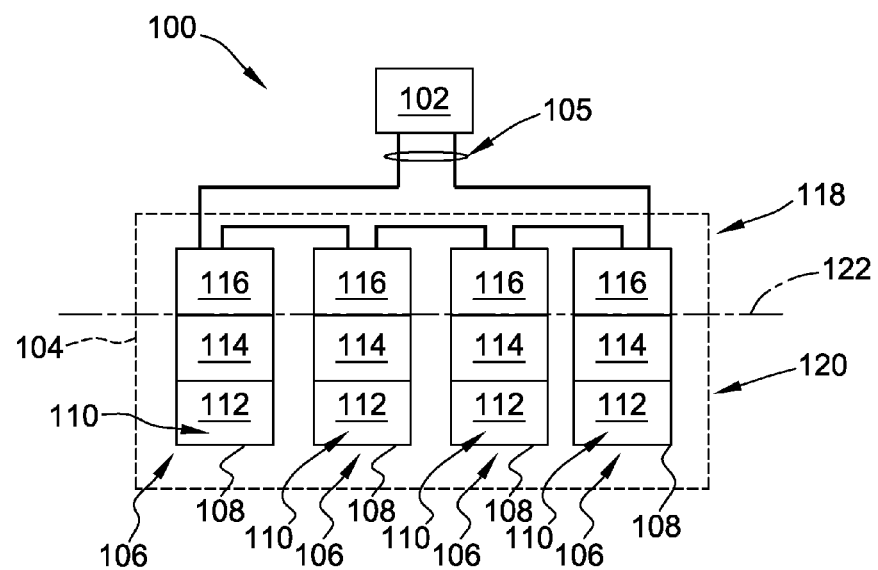
FIG. 1 is a schematic block diagram of subsea boosting system powered by a direct current (DC) power source.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to subsea boosting and systems and methods for subsea boosting in a high-voltage direct current (HVDC) and high-voltage alternating current (HVAC) transmission and distribution system. More particularly, embodiments of this disclosure relate to a modular, vertically integrated system architecture for subsea boosting, in which one or more subsea modules are combined to form a subsea boosting system. Each of the subsea modules integrates a motor, pump and electronic power components into a single module. The subsea modules are compartmentalized pressure vessels, with each compartment being assembled to the module as its equipment is installed. The vessel shape is conducive to handling different pressures in different compartments, while limiting the cross section of the module. Some, exemplary embodiments substantially minimize the number of power penetrators utilized in the subsea boosting module, resulting in higher reliability and lower costs. The modular approach allows subsea boosting systems to be built to match a desired system power, as well as maintaining partial availability to reduce system down-time. The subsea boosting modules generally have a lower size and mass per module than the large components of a non-modularized system.

The following description refers to the accompanying drawings, in which, in the absence of a contrary representation, the same numbers in different drawings represent similar elements.

FIG. 1 is a schematic block diagram of subsea boosting system 100 powered by a direct current (DC) power source 102. In the exemplary embodiment, DC power source 102 is a platform based alternating current (AC) to DC power converter that converts AC power from an AC power source, e.g., without limitation, an AC power grid, to DC power. In other embodiments, DC power source 102 may be a land based DC power source, a DC power generator (land or platform based), or any other suitable DC power source. DC power source 102 is a high voltage DC power source. In the exemplary embodiment, DC power source 102 provides up to several tens of kilovolt (kV) DC output. In an embodiment, DC power source 102 provides up to thirty kV DC output. In other embodiments, DC power source provides any other suitable high voltage DC output that enables operation of subsea boosting system 100 as described herein.

A subsea boosting assembly 104 is electrically coupled to and receives DC power from DC power source 102 via a two wire umbilical cable 105. Subsea boosting assembly 104 includes multiple subsea boosting modules 106 electrically coupled together, mechanically coupled together, and coupled together in fluid communication with each other. Subsea boosting modules 106 are mechanically coupled together by attachment to each other directly or indirectly using, for example, welding, fasteners, straps, or any other suitable mechanical connection. In the illustrated embodiment, assembly 104 includes four subsea boosting modules 106. In other embodiments, assembly 104 may include more or fewer (including one) subsea boosting modules 106. The number of subsea boosting modules 106 is generally selected to provide an assembly 104 with the desired pumping power. Thus, each module 106 may be a smaller size than desired total pumping power. For example, rather than utilizing a single, large six MVA pump, three smaller subsea boosting modules 106, each rated at two MVA, may be utilized.

Each subsea boosting module 106 includes a housing 108 defining an interior 110. A fluid pump 112 is disposed within interior 110 of housing 108. An electric motor 114 is disposed within interior 110 of housing 108 and is coupled to fluid pump 112 to drive fluid pump 112. Fluid pump 112 and electric motor 114 may be any suitable fluid pump and motor for driving the selected fluid pump. Fluid pump 112, alone or in combination with motor 114, may be a fluid pump, a compressor, a fan, or any other suitable device for transferring or manipulating a liquid, a gas, or any other fluid. Moreover, fluid pump 112 may be any process pump suitable for use in a subsea boosting system. The combination of electric motor 114 and fluid pump 112 will have a smaller power rating (in, e.g., MVA) than the complete subsea boosting system 100 and a comparable single pump boosting system.

Power components 116 are disposed within interior 110 of housing 108 to provide power to electric motor 114. Power components 116 generally include all components needed to power electric motor 114 to drive fluid pump 112 from the DC power received from source 102. In some embodiments, power components 116 include one or more DC to AC (DC/AC) power converters (not shown in FIG. 1). The DC/AC power converters may be any suitable isolated or non-isolated DC/AC power converters. Moreover, the DC/AC power converters may each include any suitable number of converter stages. For example, a DC/AC power converter may be a single stage DC/AC converter. Alternatively, a DC/AC power converter may include one or more DC to DC power converter stages, followed by a DC/AC converter stage. In some embodiments, power components 116 include one or more transformers (not shown in FIG. 1) for isolating a DC side 118 of system 100 from an AC side 120 of system 100 (separated in FIG. 1 by an isolation line 122). The transformers may be separate transformers and/or may be a part of one or more stages of the DC/AC power converter.

Subsea boosting modules 106 are electrically coupled together in series. One wire of umbilical cable 105 is connected to the first subsea boosting module 106 in the series, while the second wire of umbilical cable 105 is connected to the last subsea boosting module 106 in the series.

Various additional components and/or systems (not shown in FIG. 1) may be included in some embodiments of subsea boosting modules 106. For example, subsea boosting modules 106 may include a bypass module coupled between the DC power input and power components 116. The bypass module permits selective bypassing of the subsea boosting module 106 by electrically disconnecting it from DC power source 102 and the other subsea boosting modules 106, e.g., in response to a received instruction, in response to a detected condition etc. Moreover, in some embodiments, the bypass module permits selective coupling of one or more components of the power components 116 to DC power source 102 and/or other subsea boosting modules 106. Some embodiments include one or more cooling systems within housing 108 of subsea boosting modules 106. Cooling systems may include active and/or passive cooling systems used to cool fluid pump 112, electric motor 114, and/or power components 116. In some embodiments, active cooling systems include one or more cooling pumps powered by electric motor 114.

In some embodiments, housing 108 of subsea boosting module 106 defines two or more interior chambers (not shown in FIG. 1). Fluid pump 112 and electric motor 114 are disposed in one chamber of subsea boosting module 106, while power components 116 and additional components are disposed in one or more other chambers of subsea boosting module. In another example embodiment, fluid pump 112 and electric motor 114 are disposed in a chamber of subsea boosting module 106 that is configured to maintain substantially the same pressure within the chamber as the ambient pressure outside housing 108. Power components 116 are disposed in a different chamber of subsea boosting module 106 that is configured to maintain a substantially constant pressure within the chamber without regard to the ambient pressure outside housing 108. In a particular embodiment, power components 116 are disposed in a chamber of subsea boosting module 106 that is configured to maintain a substantially constant pressure of one atmosphere within the chamber. Additional components may be housed within the same chamber as power components 116 or in a different chamber, which may maintain a constant pressure or maintain a pressure the same as the ambient pressure around housing 108.

Fluid pumps 112 of subsea boosting modules 106 may be coupled together in fluid communication with each other in series or in parallel. When coupled together in series, bypass valves and/or recirculation valves may be used to permit selective bypassing of selected subsea boosting module(s) 106, e.g., without limitation, when one subsea boosting module 106 is blocked and/or has a fault.

FIGS. 2-7 are cross sectional views of exemplary embodiments of subsea boosting modules for use as subsea boosting modules 106 in system 100 (shown in FIG. 1). Similar components in FIGS. 2-7 are identified with the same reference numbers.

Figure 2:
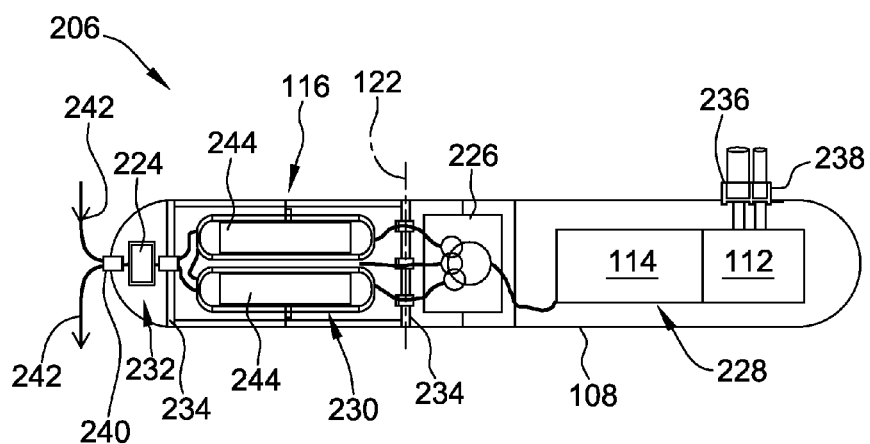
FIG. 2 is a cross-sectional view of an exemplary subsea boosting module for use in the system shown in FIG. 1.

FIG. 2 is a cross-sectional view of an exemplary subsea boosting module 206 for use in the system 100. Subsea boosting module 206, shown in FIG. 2, includes a bypass module 224, power components 116, a transformer 226, electric motor 114, and fluid pump 112.

Housing 108 defines three chambers 228, 230, and 232 separated by dividers 234, which may also be referred to as bulkheads. Chambers 228 and 232 are configured to maintain substantially the same pressure as the ambient pressure outside of housing 108, while chamber 230 is configured to maintain a substantially constant pressure (e.g., about 101.325 kilopascals) regardless of the ambient pressure outside housing 108. A fluid inlet 236 and a fluid outlet 238 are coupled to housing 108 to permit fluid communication to fluid pump 112.

Interface 240 (which may also be referred to as an input) couples DC power from DC power source 102 (shown in FIG. 1) to subsea boosting module 206 (and more specifically to bypass module 224). Subsea boosting module 206 may also be coupled in series with other subsea boosting modules 206 via interface 240. Thus wires 242 may be wires interconnecting subsea boosting module 206 with other subsea boosting modules 206, and/or may be one or both wires from umbilical cable 105 (shown in FIG. 1). Interface 240 is configured for a wet mateable connection, i.e., it includes a wet mateable connector, with wires 242.

In subsea boosting module 206, power components 116 include three power converters 244 (one of which is not shown). The exemplary power converters 244 are non-isolated DC/AC converters. Power converters 244 are configured to receive DC power from source 102 through interface 240 and bypass module 224, and to output AC power to motor 114 through transformer 226. In the exemplary embodiment, all three power converters 244 are needed to provide the desired power output for operation of electric motor 114. In other embodiments a single power converter 244 or two power converters 244 may be sufficient to power electric motor 114, and the second and/or third power converter 244 may be one or more redundant power converters 244.

Figure 3:
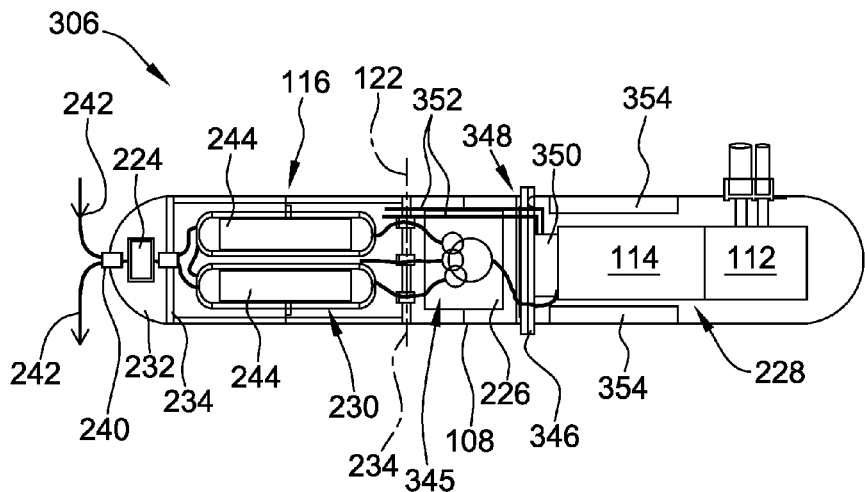
FIG. 3 is a cross-sectional view of an alternative subsea boosting module for use in the system shown in FIG. 1.

FIG. 3 is a cross-sectional view of an alternative subsea boosting module 306 for use in system 100 (shown in FIG. 1). In this embodiment, housing 108 defines an additional chamber 345 in which transformer 226 is disposed. Subsea boosting module 306 includes a flange 346. Flange 346 separates chamber 228 from chamber 345. In some embodiments, one or more of dividers 234 are used in lieu of flanges 346. Alternatively, one or more flanges 346 are used in lieu of dividers 234.

Subsea boosting module 306 includes a cooling system 348 for cooling power converters 244 and electric motor 114. Cooling system 348 includes a pump 350 for pumping coolant through cooling system 348. Pump 350 is rotatably coupled to and powered by electric motor 114. Cooling system 348 pumps coolant through coolant pipes 352 to power converters 244, and pumps coolant through coiled tubes 354 for external cooling of electric motor 114. In other embodiments, motor 114 and power components 116 may be cooled using separate cooling systems 348. Moreover, some embodiments may include additional cooling components. For example, additional external coils may be added around power converters 244 to provide additional external cooling.

Figure 4:
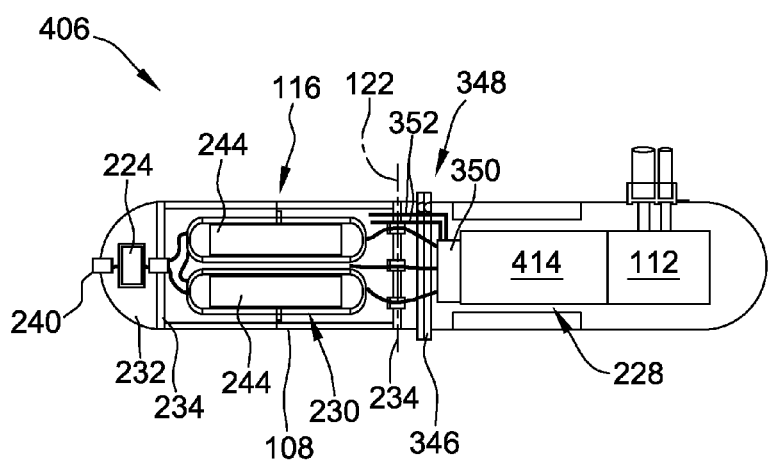
FIG. 4 is a cross-sectional view of a another alternative subsea boosting module for use in the system shown in FIG. 1.

FIG. 4 is a cross-sectional view of another alternative subsea boosting module 406 for use in system 100 (shown in FIG. 1). In this embodiment, motor 114 is replaced with an electric motor 414 that includes sufficiently rated electrical insulation for high voltage to ground such that a transformer is not needed.

Figure 5:
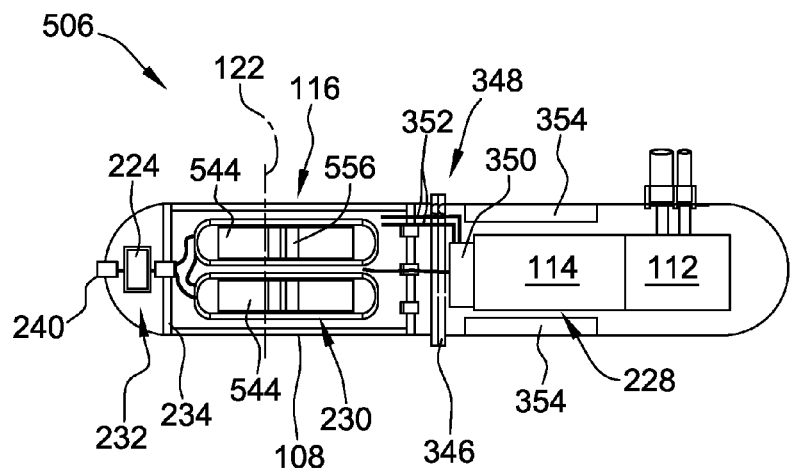
FIG. 5 is a cross-sectional view of yet another alternative subsea boosting module for use in the system shown in FIG. 1.

FIG. 5 is a cross-sectional view of yet another alternative subsea boosting module 506 for use in system 100 (shown in FIG. 1). In subsea boosting module 506, power converters 244 are replaced with power converters 544. Power converters 544 are isolated power converters that include integrated transformers 556. Thus, a separate transformer is not utilized.

Figure 6:
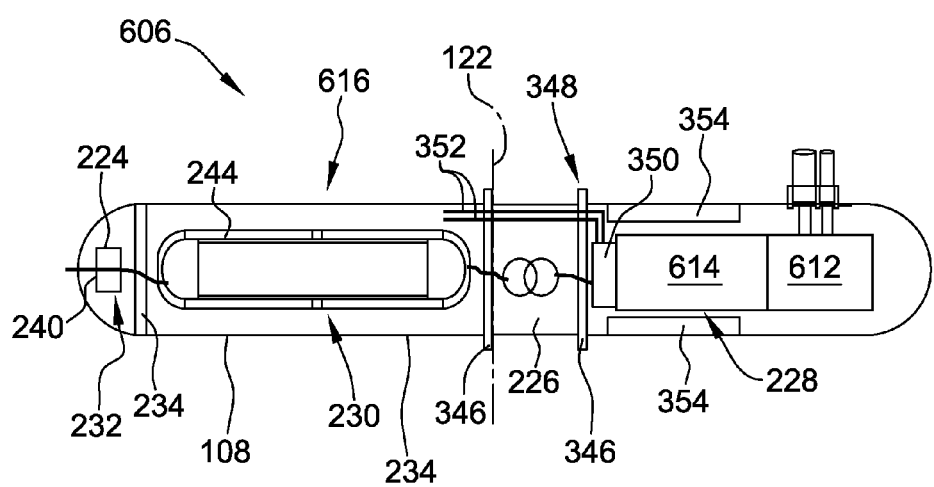
FIG. 6 is a cross-sectional view of a further alternative subsea boosting module for use in the system shown in FIG. 1.

FIG. 6 is a cross-sectional view of another alternative subsea boosting module 606 for use in system 100 (shown in FIG. 1). Subsea boosting module 606 is smaller than subsea boosting modules 206, 306, 406, and 506. Subsea boosting module 606 includes power components 616, electric motor 614 and fluid pump 612. Power components 616 include a single power converter 244. Electric motor 614 and fluid pump 612 are rated for a lower power than electric motor 114 and fluid pump 112 in subsea boosting modules 206, 306, 406, and 506, but are otherwise similar. Because motor 614 and pump 612 require less power, only a single power converter 244 is needed to power electric motor 114 in subsea boosting module 606.

Figure 7:
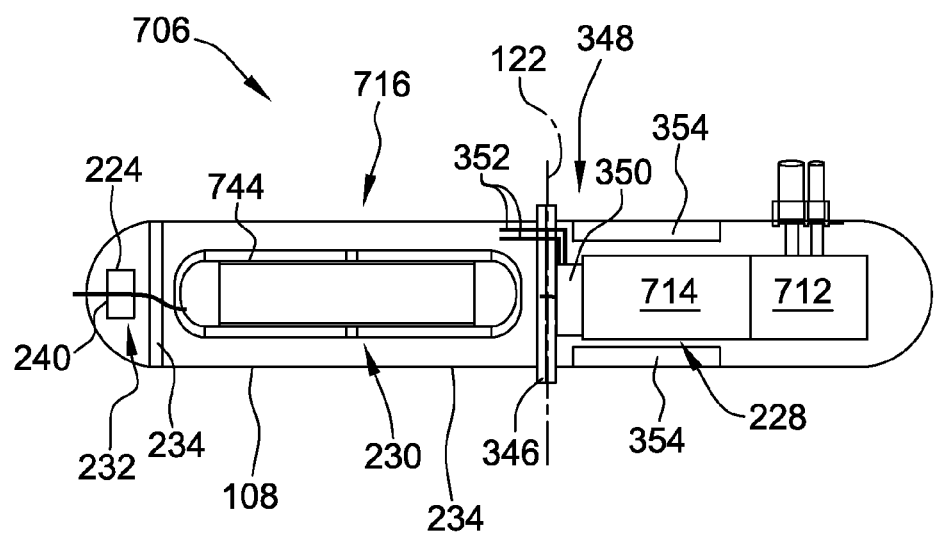
FIG. 7 is a cross-sectional view of a yet another alternative subsea boosting module for use in the system shown in FIG. 1.

FIG. 7 is a cross-sectional view of another alternative subsea boosting module 706 for use in system 100 (shown in FIG. 1). Subsea boosting module 706 is similar to subsea boosting module 606. Subsea boosting module 706 includes power components 716, electric motor 714, and fluid pump 712. Power components 716 include a single power converter 744. Subsea boosting module 706 does not include a separate transformer 226. Rather, power converter 744 may be an isolated power converter and/or electric motor 714 may have electric insulation suitable for use without a transformer.

Figure 8:
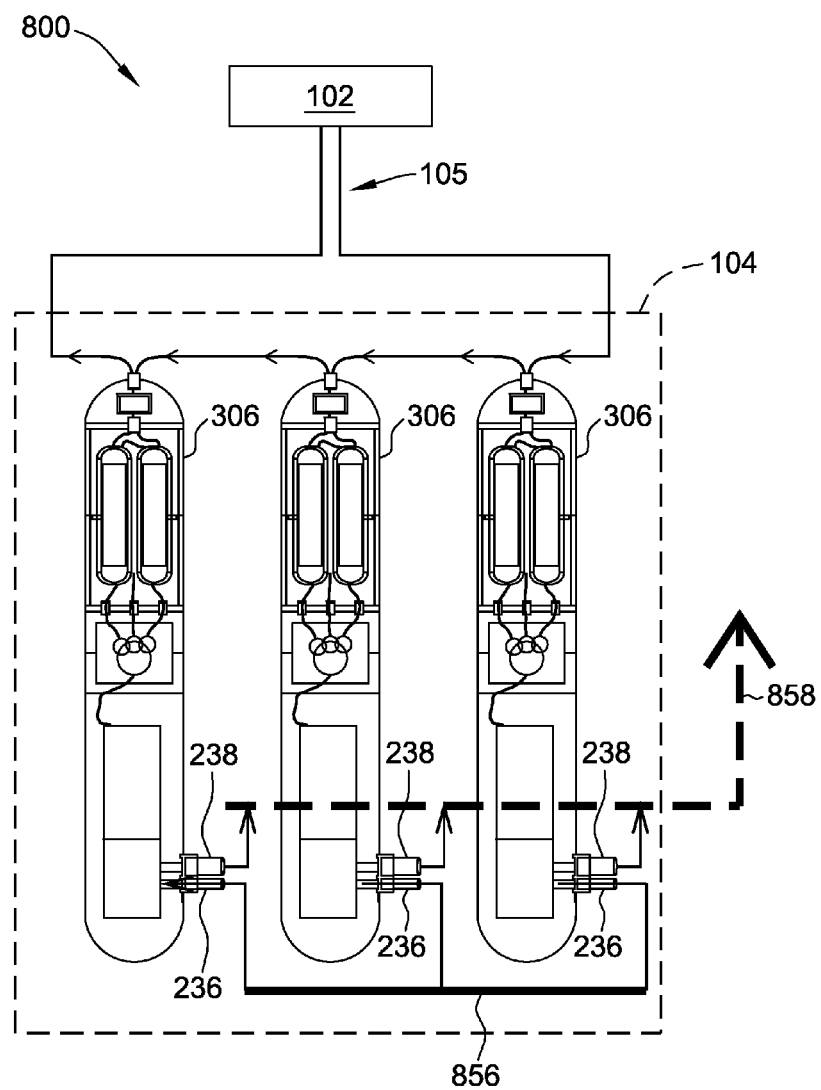
FIG. 8 is a diagram of a subsea boosting system including an assembly of three of the subsea boosting modules shown in FIG. 3.

FIG. 8 is a diagram of an exemplary subsea boosting system 800 including an assembly 104 of three subsea boosting modules 306 (shown in FIG. 3). In other embodiments, assembly 104 may be formed from subsea boosting modules 206, 406, 506, 606, and/or 706. Subsea boosting modules 306 are electrically connected in series and are connected in parallel fluid communication. The parallel fluid input is shown by input flows 856 and the parallel fluid output is shown by output flows 858. In other embodiments, subsea boosting modules 306 are connected in series, in multiple stages, and/or in any other suitable configuration.

Figure 9:
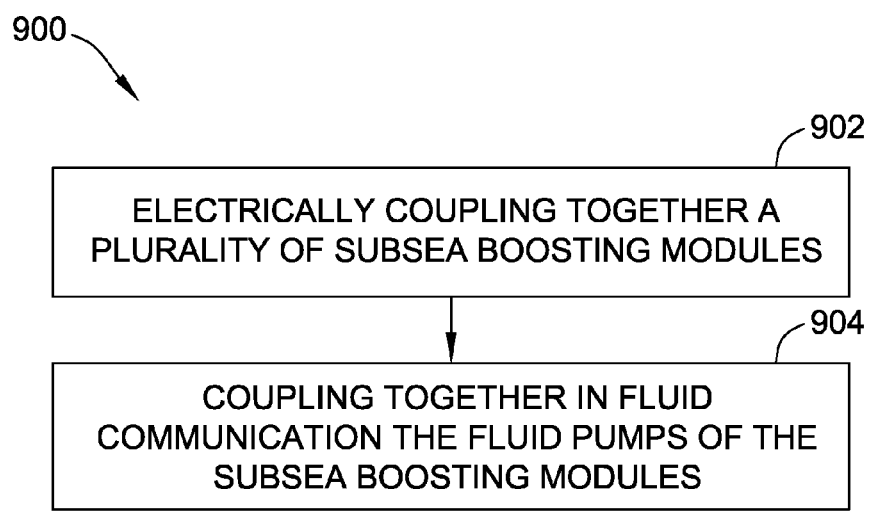
FIG. 9 is block diagram of a method of producing a subsea boosting system for use with a DC power system.

FIG. 9 is a block diagram of a method 900 of producing a subsea boosting system for use with a DC power system, such as system 100 or 700. Method 900 may be used to produce a subsea boosting system with a first power rating. The method includes electrically coupling 902 together a plurality of subsea boosting modules (such as subsea boosting modules 106, 206, 306, 406, 506, or 606). Each subsea modules has a second power rating that is less than the first power rating. Each boosting module includes a fluid pump, an electric motor, and a plurality of power components. At 904, the fluid pumps of the subsea boosting modules are coupled together in fluid communication with each other. Accordingly, a large boosting assembly with a first power rating is created from a plurality of smaller, lower power rated modules. In other embodiments, each boosting module includes any other suitable fluid pump.

Figure 10:
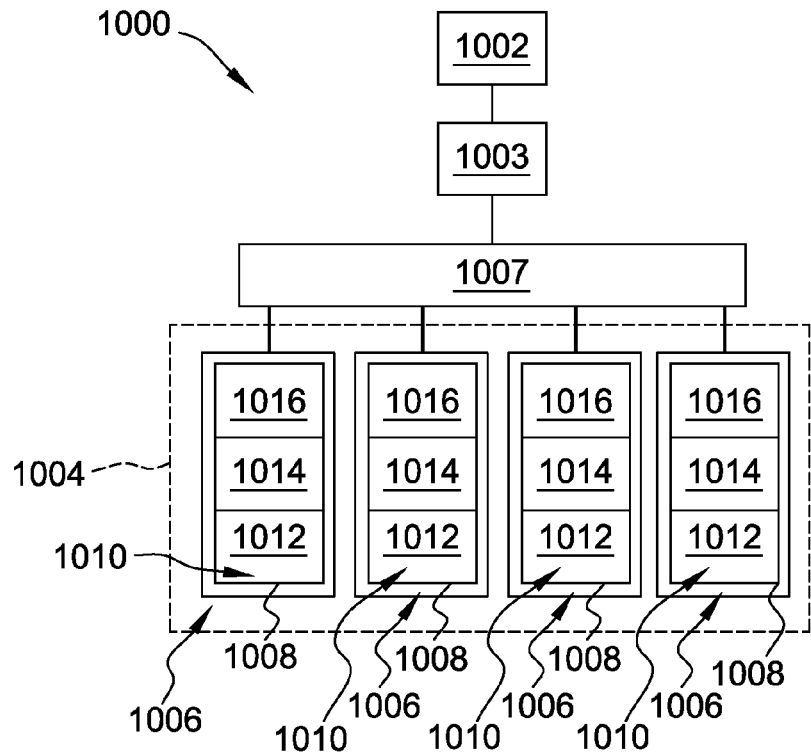
FIG. 10 is a schematic block diagram of subsea boosting system powered by an alternating current (AC) power source.

FIG. 10 is a schematic block diagram of subsea boosting system 1000 powered by an alternating current (AC) power source 1002. In the exemplary embodiment, AC power source 1002 is a land based AC power grid. In other embodiments, AC power source 1002 may be a sea platform based AC power source, an AC/AC power converter (land or platform based), or any other suitable AC power source. AC power source 1002 is a high voltage AC power source. Alternatively, AC power source 1002 may be a medium voltage AC power source followed by a step up transformer. In the exemplary embodiment, AC power source 1002 provides up to several tens of kilovolt (kV) AC output. In an embodiment, AC power source 1002 provides up to a sixty kV AC output. In other embodiments, AC power source 1002 provides any other suitable high voltage AC output that enables operation of subsea boosting system 1000 as described herein.

AC power source 1002 is coupled to a step down transformer 1003. Step down transformer 1003 reduces the magnitude of the voltage received from AC power source 1002. In one example, step down transformer 1003 reduces the AC voltage from about one hundred kV to about thirty-six kV. In other embodiments, step down transformer 1003 reduces the AC voltage from AC power source to any other suitable high voltage AC output that enables operation of subsea boosting system 1000 as described herein.

The reduced AC voltage output by step down transformer 1003 is coupled to a subsea boosting assembly 1004 through a subsea switchgear assembly 1007. Subsea switchgear assembly 1007 provides electrical protection and control over distribution of power to subsea boosting assembly 1004. Subsea switchgear assembly 1007 may include a plurality of circuit breakers, or other circuit protection devices (not shown in FIG. 10). Subsea boosting assembly 1004 includes multiple subsea boosting modules 1006 electrically coupled together, mechanically coupled together, and coupled together in fluid communication with each other. Subsea boosting modules 1006 are electrically coupled together in parallel through subsea switchgear 1007. Subsea boosting modules 1006 are mechanically coupled together by attachment to each other directly or indirectly using, for example, welding, fasteners, straps, or any other suitable mechanical connection. In the illustrated embodiment, assembly 1004 includes four subsea boosting modules 1006. In other embodiments, assembly 1004 may include more or fewer (including one) subsea boosting modules 1006. The number of subsea boosting modules 1006 is generally selected to provide an assembly 1004 with the desired pumping power. Thus, each module 1006 may be a smaller size than desired total pumping power.

Each subsea boosting module 1006 includes a housing 1008 defining an interior 1010. A fluid pump 1012 is disposed within interior 1010 of housing 1008. An electric motor 1014 is disposed within interior 1010 of housing 1008 and is coupled to fluid pump 1012 to drive fluid pump 1012. Fluid pump 1012 and electric motor 1014 may be any suitable fluid pump and motor for driving the selected fluid pump. Fluid pump 1012, alone or in combination with motor 1014, may be a fluid pump, a compressor, a fan, or any other suitable device for transferring or manipulating a liquid, a gas, or any other fluid. Moreover, fluid pump 1012 may be any process pump suitable for use in a subsea boosting system. Electric motor 1014 may be a single phase motor or a multiphase motor. The combination of electric motor 1014 and fluid pump 1012 will have a smaller power rating (in, e.g., MVA) than the complete subsea boosting system 1000 and a comparable single pump boosting system.

Power components 1016 are disposed within interior 1010 of housing 1008 to provide power to electric motor 1014. Power components 1016 generally include all components needed to power electric motor 1014 to drive fluid pump 1012 from the AC power received from source 1002. In some embodiments, power components 1016 include one or more AC to AC (AC/AC) power converters (not shown in FIG. 10). The AC/AC power converters may be any suitable isolated or non-isolated AC/AC power converters. Moreover, the AC/AC power converters may each include any suitable number of converter stages. For example, an AC/AC power converter may be a single stage AC/AC converter. Alternatively, an AC/AC power converter may include an AC to DC power converter stage, followed by one or more DC/DC converter stages and a DC/AC converter stage. In some embodiments, power components 1016 include one or more transformers (not shown in FIG. 10). The transformers may be separate transformers and/or may be a part of one or more stages of the AC/AC power converter.

Various additional components and/or systems (not shown in FIG. 10) may be included in some embodiments of subsea boosting modules 1006. For example, subsea boosting modules 1006 may include a switchgear module coupled between the AC power input and power components 1016. The switchgear module permits selective disconnecting of the subsea boosting module 1006 from AC power source 1002 and the other subsea boosting modules 1006, e.g., in response to a received instruction, in response to a detected condition etc. Moreover, in some embodiments, the switchgear module permits selective coupling of one or more components of the power components 1016 to AC power source 1002. Some embodiments include one or more cooling systems within housing 1008 of subsea boosting modules 1006. Cooling systems may include active and/or passive cooling systems used to cool fluid pump 1012, electric motor 1014, and/or power components 1016. In some embodiments, active cooling systems include one or more cooling pumps powered by electric motor 1014.

In some embodiments, housing 1008 of subsea boosting module 1006 defines two or more interior chambers (not shown in FIG. 10). Fluid pump 1012 and electric motor 1014 are disposed in one chamber of subsea boosting module 1006, while power components 1016 and additional components are disposed in one or more other chambers of subsea boosting module. In another example embodiment, fluid pump 1012 and electric motor 1014 are disposed in a chamber of subsea boosting module 1006 that is configured to maintain substantially the same pressure within the chamber as the ambient pressure outside housing 1008. Power components 1016 are disposed in a different chamber of subsea boosting module 1006 that is configured to maintain a substantially constant pressure within the chamber without regard to the ambient pressure outside housing 1008. In a particular embodiment, power components 1016 are disposed in a chamber of subsea boosting module 1006 that is configured to maintain a substantially constant pressure of one atmosphere within the chamber. Additional components may be housed within the same chamber as power components 1016 or in a different chamber, which may maintain a constant pressure or maintain a pressure the same as the ambient pressure around housing 1008.

Fluid pumps 1012 of subsea boosting modules 1006 may be coupled together in fluid communication with each other in series or in parallel. When coupled together in series, bypass valves and/or recirculation valves may be used to permit selective bypassing of selected subsea boosting module(s) 1006, e.g., without limitation, when one subsea boosting module 1006 is blocked and/or has a fault.

Figure 11:
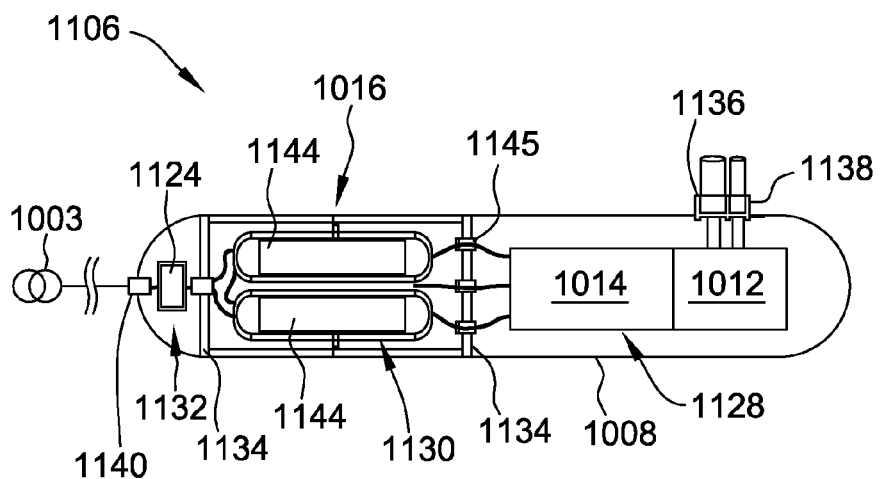
FIG. 11 is a cross-sectional view of an exemplary subsea boosting module for use in the system shown in FIG. 10.
Figure 12:
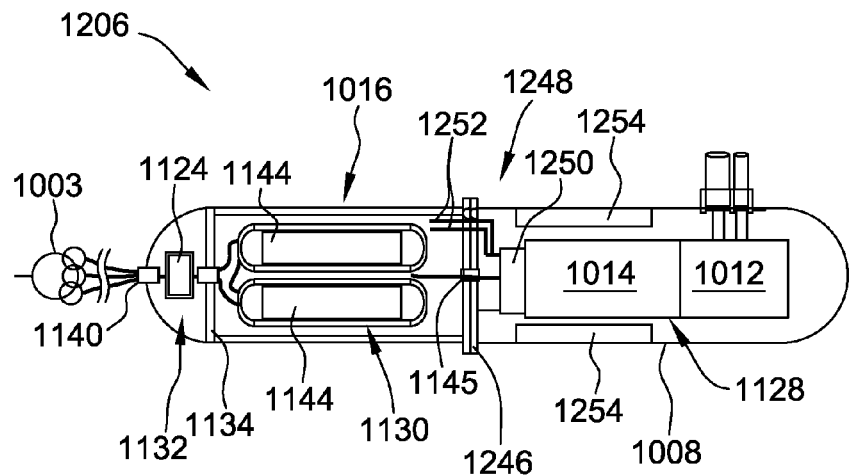
FIG. 12 is a cross-sectional view of an alternative subsea boosting module for use in the system shown in FIG. 10.
Figure 13:
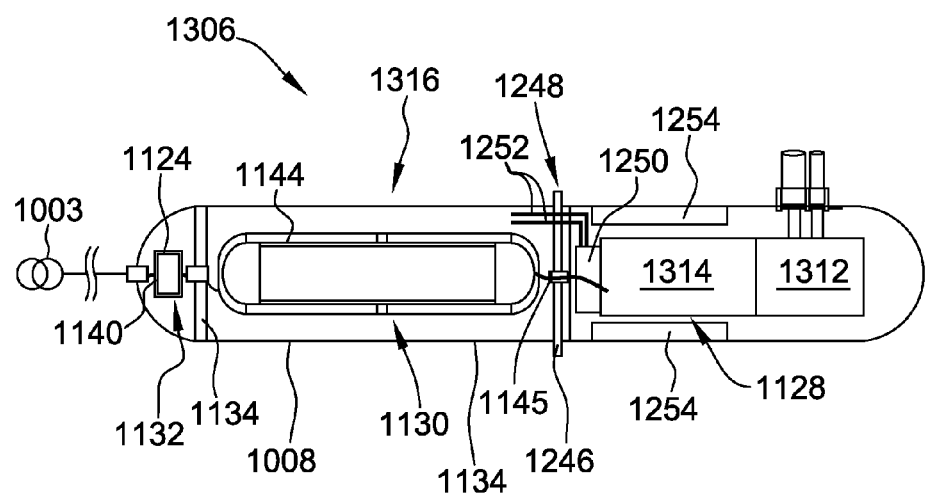
FIG. 13 is a cross-sectional view of a another alternative subsea boosting module for use in the system shown in FIG. 10.

FIGS. 11-13 are cross sectional views of exemplary embodiments of subsea boosting modules for use as subsea boosting modules 1006 in system 1000 (shown in FIG. 10). Similar components in FIGS. 11-13 are identified with the same reference numbers.

FIG. 11 is a cross-sectional view of an exemplary subsea boosting module 1106 for use in the system 1000. Subsea boosting module 1106, shown in FIG. 11, includes a switchgear module 1124, power components 1016, electric motor 1014, and fluid pump 1012.

Housing 1008 defines three chambers 1128, 1130, and 1132 separated by dividers 1134, which may also be referred to as bulkheads. Chambers 1128 and 1132 are configured to maintain substantially the same pressure as the ambient pressure outside of housing 1008, while chamber 1130 is configured to maintain a substantially constant pressure (e.g., about 101.325 kilopascals) regardless of the ambient pressure outside housing 1008. A fluid inlet 1136 and a fluid outlet 1138 are coupled to housing 1008 to permit fluid communication to fluid pump 1012.

Interface 1140 (which may also be referred to as an input) couples AC power from AC power source 1002 (shown in FIG. 10) to subsea boosting module 1106 (and more specifically to switchgear module 1124). Interface 1140 is a wet mateable connector (also sometimes referred to as a wet mateable penetrator).

In subsea boosting module 1106, power components 1016 include three power converters 1144 (one of which is not shown). The exemplary power converters 1144 are AC/AC converters. Power converters 1144 are configured to receive AC power from source 1002 through interface 1140 and switchgear module 1124, and to output AC power to motor 1014 (which is a nine phase motor in this embodiment) through three dry mateable connectors 1145. In the exemplary embodiment, all three power converters 1144 are needed to provide the desired power output for operation of electric motor 1014. In other embodiments a single power converter 1144 or two power converters 1144 may be sufficient to power electric motor 1014, and the second and/or third power converter 1144 may be one or more redundant power converters 1144.

FIG. 12 is a cross-sectional view of an alternative subsea boosting module 1206 for use in system 1000 (shown in FIG. 10). In this embodiment, subsea boosting module 1206 is designed for connection to a multi-winding transformer. Electric motor 1014 is a three phase motor in this embodiment, and a single dry-mateable connector 1145 is used. Subsea boosting module 1206 includes a flange 1246. Flange 1246 separates chamber 1128 from chamber 1130. In some embodiments, one or more of dividers 1134 are used in lieu of flanges 1246. Alternatively, one or more flanges 1246 are used in lieu of dividers 1134.

Subsea boosting module 1206 includes a cooling system 1248 for cooling power converters 1144 and electric motor 1014. Cooling system 1248 includes a pump 1250 for pumping coolant through cooling system 1248. Pump 1250 is rotatably coupled to and powered by electric motor 1014. Cooling system 1248 pumps coolant through coolant pipes 1252 to power converters 1144, and pumps coolant through coiled tubes 1254 for external cooling of electric motor 1014. In other embodiments, motor 1014 and power components 1016 may be cooled using separate cooling systems 1248. Moreover, some embodiments may include additional cooling components. For example, additional external coils may be added around power converters 1144 to provide additional external cooling.

FIG. 13 is a cross-sectional view of another alternative subsea boosting module 1306 for use in system 1000 (shown in FIG. 10). Subsea boosting module 1306 is smaller than subsea boosting modules 1106 and 1206. Subsea boosting module 1306 includes power components 1316, electric motor 1314 and fluid pump 1312. Power components 1316 include a single power converter 1144. Electric motor 1314 and fluid pump 1312 are rated for a lower power than electric motor 1014 and fluid pump 1012 in subsea boosting modules 1106 and 1206, but are otherwise similar. Because motor 1314 and pump 1312 require less power, only a single power converter 1144 is needed to power electric motor 1014 in subsea boosting module 1306.

Figure 14:
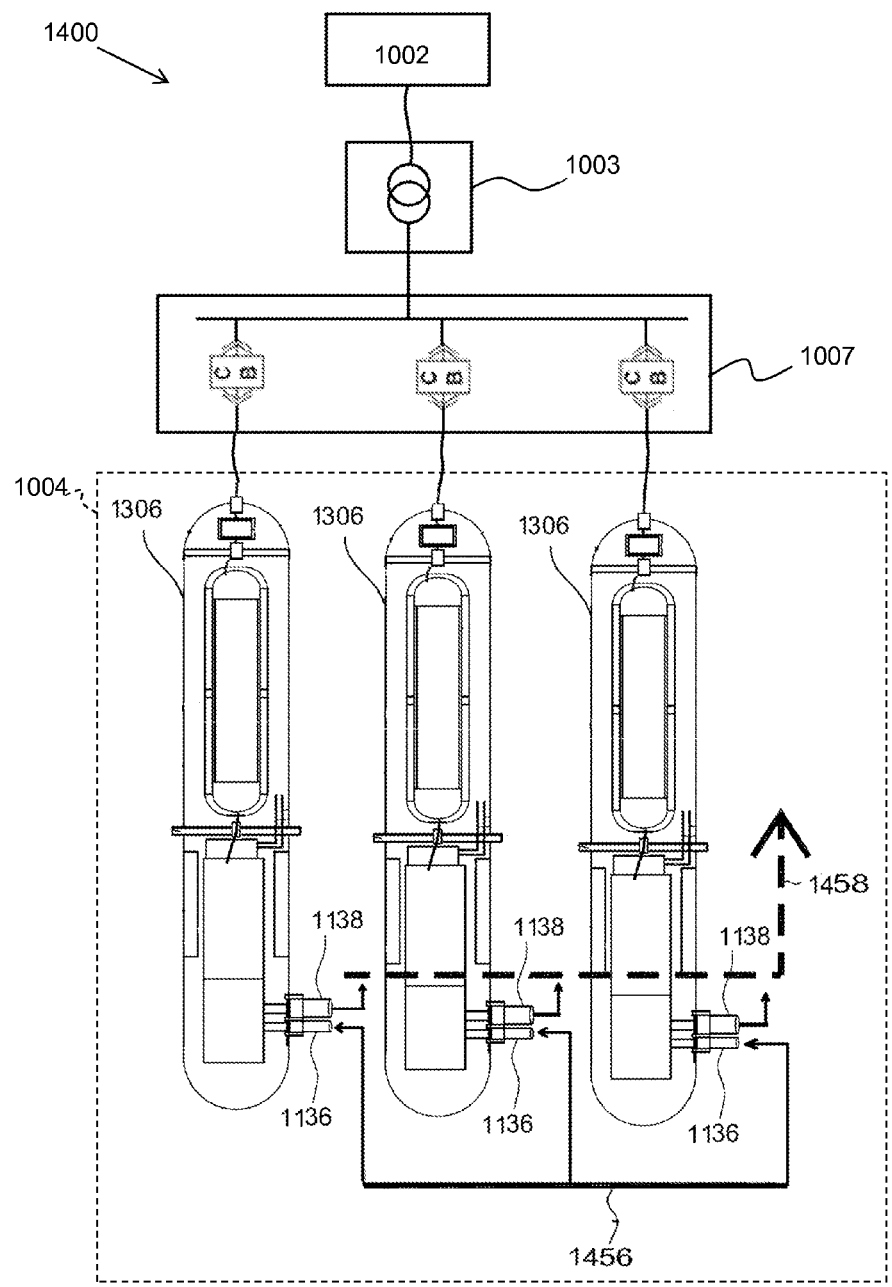
FIG. 14 is a diagram of a subsea boosting system including an assembly of four of the subsea boosting modules shown in FIG. 13.

FIG. 14 is a diagram of an exemplary subsea boosting system 1400 including an assembly 1004 of three subsea boosting modules 1306 (shown in FIG. 13). In other embodiments, assembly 1004 may be formed from subsea boosting modules 1106 and/or 1206. Subsea boosting modules 1306 are electrically connected in parallel and are connected in parallel fluid communication. The parallel fluid input is shown by input flows 1456 and the parallel fluid output is shown by output flows 1458. In some embodiments, there may be electrical cross-ties between the modules 1306 so that any motor-pump of any module 1306 can be driven by any of the other modules 1306. This provides matrixed power connectivity so that any module can drive any pump motor. Rather than an "all or nothing" approach to availability, the matrixed configuration allows partial capability/availability so that power draw can be matched to what is required thus improving overall system up-time.

Figure 15:
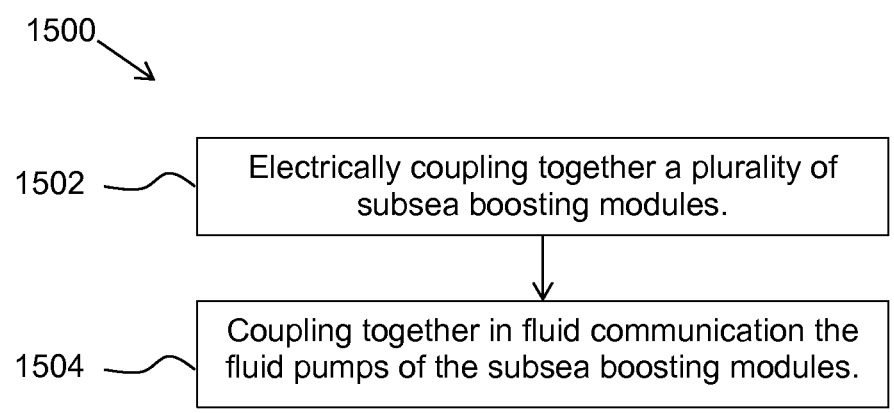
FIG. 15 is block diagram of a method of producing a subsea boosting system for use with an AC power system.

FIG. 15 is a block diagram of a method 1500 of producing a subsea boosting system for use with an AC power system, such as system 1000 or 1400. Method 1800 may be used to produce a subsea boosting system with a first power rating. The method includes electrically coupling 1502 together a plurality of subsea boosting modules (such as subsea boosting modules 1006, 1106, 1206, or 1306). Each subsea modules has a second power rating that is less than the first power rating. Each boosting module includes a fluid pump, an electric motor, and a plurality of power components. At 1504, the fluid pumps of the subsea boosting modules are coupled together in fluid communication with each other. Accordingly, a large boosting assembly with a first power rating is created from a plurality of smaller, lower power rated modules.

The exemplary subsea boosting modules described herein generally include only a single wet mateable connector and the number of critical pressure tolerant connections and penetrations is substantially minimized. Each cylindrical section of a module is a separate functional module, which may be separately assembled and tested. Auxiliary systems and cooling are shared between mechanical and electrical modules in some embodiments. After modules are assembled and tested, they may be mechanically attached together (such as by welding) to create a robust subsea vessel. Moreover, the number of modules and/or chambers within a module may be varied to meet power demand requirements of the user. The modular approach implies relative lower size and mass per module and thus shipping or installation equipment capability limits are avoided. In contrast, when a subsea boosting system must be installed in deep water, e.g. 3000 m, the weight limit of locally available installation vessels may easily be exceeded by a conventional high power boosting station.

Exemplary embodiments of the systems and methods are described above in detail. The systems and methods are not limited to the specific embodiments described herein, but rather, components of the systems and/or steps of the methods may be utilized independently and separately from other components and/or steps described herein. For example, the system may also be used in combination with other apparatus, systems, and methods, and is not limited to practice with only the system as described herein. Rather, the exemplary embodiment can be implemented and utilized in connection with many other applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A subsea boosting module for use with an alternating current (AC) power system, said module comprising:
a unitary housing enclosing an interior space and comprising a first pressure-tight bulkhead and a second pressure-tight bulkhead dividing the interior space into a first interior chamber, a second interior chamber, and a third interior chamber, said first pressure-tight bulkhead defining a first end of said second interior chamber, said second pressure-tight bulkhead defining a second end of said second interior chamber, wherein said first interior chamber is separated from said second interior chamber by said first pressure-tight bulkhead, wherein said second interior chamber is separated from said third interior chamber by said second pressure-tight bulkhead, and wherein said third interior chamber is spaced from said first interior chamber by said second interior chamber;
a fluid pump disposed within said first interior chamber;
an electric motor disposed within said first interior chamber and drivingly coupled to said fluid pump;
a plurality of power components disposed within said second interior chamber and configured to deliver power to said electric motor through said first pressure-tight bulkhead; and
a switchgear module disposed in said third interior chamber, said switchgear module coupled to said plurality of power components through said second pressure-tight bulkhead and coupled to a remote power source, said switchgear module configured for selective and local disconnection of said subsea boosting module from the remote power source.

2. The subsea boosting module in accordance with claim 1, wherein said plurality of power components comprises at least one power converter coupled to said electric motor.

3. The subsea boosting module in accordance with claim 2, wherein said at least one power converter is an AC to AC power converter.

4. The subsea boosting module in accordance with claim 1, further comprising a cooling system configured to cool at least one component of said plurality of power components, said cooling system including a cooling pump driven by said electric motor.

5. The subsea boosting module in accordance with claim 1, wherein said first interior chamber and said third interior chamber are configured to have a pressure substantially the same as an ambient pressure outside said subsea boosting module, and wherein said second interior chamber is configured to have a pressure of about one atmosphere.

6. The subsea boosting module in accordance with claim 1, wherein said switchgear module is further configured for selective and local disconnection of said subsea boosting module to said remote power source in response to one of:
- received instructions from one of the remote land-based or the remote platform-based source; or
- a locally detected condition of said subsea boosting module.

7. A subsea boosting system for use with an alternating current (AC) power system, said subsea boosting system comprising:
- a remote electric power source;
- a plurality of subsea boosting modules, each subsea boosting module comprising:
  - a fluid pump;
  - an electric motor drivingly coupled to said fluid pump;
  - a plurality of power components configured to deliver power to said electric motor, wherein said plurality of subsea boosting modules are electrically coupled together in parallel, and each said fluid pump is coupled in fluid communication to at least one other said fluid pump;
  - a unitary housing enclosing an interior space and including a first pressure-tight bulkhead and a second pressure-tight bulkhead dividing the interior space into a first interior chamber, a second interior chamber, and a third interior chamber, said first pressure-tight bulkhead defining a first end of said second interior chamber, said second pressure-tight bulkhead defining a second end of said second interior chamber, wherein said first interior chamber is separated from said second interior chamber by said first pressure-tight bulkhead, wherein said second interior chamber is separated from said third interior chamber by said second pressure-tight bulkhead, wherein said third interior chamber is spaced from said first interior chamber by said second interior chamber, wherein said fluid pump and said electric motor are disposed within said first interior chamber, and wherein said plurality of power components are disposed within said second interior chamber such that said plurality of power components are configured to deliver power to said electric motor through said first pressure-tight bulkhead; and
  - a switchgear module disposed in said third interior chamber, said switchgear module coupled to said plurality of power components through said second pressure-tight bulkhead and coupled to said remote power source, said switchgear module configured for selective and local disconnection of said subsea boosting module from said remote power source.

8. The subsea boosting system in accordance with claim 7, wherein said fluid pumps of said plurality of subsea boosting modules are coupled together in parallel fluid communication.

9. The subsea boosting system in accordance with claim 7, wherein said fluid pumps of said plurality of subsea boosting modules are coupled together in series fluid communication.

10. The subsea boosting system in accordance with claim 9, wherein said fluid pumps of said plurality of subsea boosting modules are coupled together in series fluid communication through a plurality of fluid bypass valves each configured for selective bypassing of one of said subsea modules.

11. The subsea boosting system in accordance with claim 7, wherein said plurality of power components of each subsea boosting module comprises an AC to AC power converter configured to receive an AC power input and provide an AC power output to said associated electric motor.

12. The subsea boosting module in accordance with claim 7, wherein said switchgear module is further configured for selective and local disconnection of said subsea boosting module to said remote power source in response to one of:
- received instructions from one of the remote land-based or the remote platform-based source; or
- a locally detected condition of said subsea boosting module.

13. A method of producing a subsea boosting system for use with an alternating current (AC) power system, the subsea boosting system having a first power rating, said method comprising:
- electrically coupling together a plurality of subsea boosting modules in parallel, each subsea boosting module of the plurality of subsea boosting modules including a fluid pump, an electric motor, a plurality of power components, a switchgear module coupled to the plurality of power components, and a unitary housing defining a first interior chamber, a second interior chamber, and a third interior chamber;
- coupling a first pressure-tight bulkhead and a second pressure-tight bulkhead within each unitary housing, the first pressure-tight bulkhead defining a first end of the second interior chamber, the second pressure-tight bulkhead defining a second end of the second interior chamber, wherein the first interior chamber is separated from the second interior chamber by the first pressure-tight bulkhead, wherein the second interior chamber is separated from the third interior chamber by the second pressure-tight bulkhead, wherein the third interior chamber is spaced from the first interior chamber by the second interior chamber, wherein for each subsea boosting module, the fluid pump and the electric motor, the plurality of power components, and the switchgear module are disposed within the first interior chamber, the second interior chamber, and the third interior chamber, respectively, wherein the plurality of power components are configured to deliver power to the electric motor through the first pressure-tight bulkhead, and wherein the switchgear module is coupled to the plurality of power components through the second pressure-tight bulkhead, each of the subsea boosting modules having a second power rating less than the first power rating;
- electrically coupling, for each subsea boosting module, the switchgear module to a remote electric power source, the switchgear module configured for selective and local disconnection of the associated subsea boosting module from the power source; and
- coupling together in fluid communication each fluid pump of the plurality of fluid pumps.

14. The method in accordance with claim 13, wherein coupling together in fluid communication each fluid pump of the plurality of fluid pumps comprises coupling the fluid pumps together in parallel fluid communication.

15. The method in accordance with claim 13, wherein coupling together in fluid communication each fluid pump of the plurality of fluid pumps comprises coupling the fluid pumps together in series fluid communication.

16. The method in accordance with claim 15, wherein coupling together in fluid communication each fluid pump of the plurality of fluid pumps comprises coupling the fluid pumps together in series fluid communication through at least one bypass valve.

17. The method in accordance with claim 13, further comprising mechanically coupling together the plurality of subsea boosting modules into an assembly of subsea boosting modules.

18. The method in accordance with claim 13, further comprising coupling the plurality of subsea boosting modules to a subsea switchgear assembly.

19. The method in accordance with claim 13, wherein the switchgear module is further configured for selective and local disconnection of the associated subsea boosting module from the power source in response to one of:
   received instructions from one of a remote land-based or a remote platform-based source; or
   a locally detected condition of said subsea boosting module.

* * * * *